United States Patent
Chow et al.

(10) Patent No.: US 8,971,718 B2
(45) Date of Patent: Mar. 3, 2015

(54) DOWN-SAMPLING CLOCK AND DATA RECOVERY CIRCUIT HAVING SELECTABLE RATE AND PHASE OUTPUT AND METHOD OF OPERATION THEREOF

(75) Inventors: Hungkei Chow, Livingston, NJ (US); Dusan Suvakovic, Pleasanton, CA (US); Christophe Van Praet, Ghent (BE); Guy Torfs, Ghent (BE); Xin Yin, Ghent (BE); Zhisheng Li, Ghent (BE)

(73) Assignee: Alcatel Lucent, Boulogne-Billancourt (FR)

( * ) Notice: Subject to any disclaimer, the term of this patent is extended or adjusted under 35 U.S.C. 154(b) by 280 days.

(21) Appl. No.: 13/486,552

(22) Filed: Jun. 1, 2012

(65) Prior Publication Data

US 2013/0322885 A1 Dec. 5, 2013

(51) Int. Cl.
*H04B 10/00* (2013.01)
*H04L 7/033* (2006.01)
*H03L 7/08* (2006.01)
*H04L 25/06* (2006.01)
*H03L 7/087* (2006.01)

(52) U.S. Cl.
CPC ............ *H04L 7/0337* (2013.01); *H03L 7/0807* (2013.01); *Y02B 60/31* (2013.01); *H04L 25/06* (2013.01); *H03L 7/087* (2013.01)
USPC .............................. 398/155; 398/138; 398/150

(58) Field of Classification Search
CPC ...... H04B 10/40; H04B 10/43; H04B 10/299; H04B 10/6165
USPC ................................... 398/138–139, 150, 155
See application file for complete search history.

(56) References Cited

U.S. PATENT DOCUMENTS

| | | | | |
|---|---|---|---|---|
| 2005/0180536 A1* | 8/2005 | Payne et al. | ................... | 375/354 |
| 2005/0265486 A1* | 12/2005 | Crawley | ........................ | 375/326 |
| 2006/0002415 A1* | 1/2006 | Heston et al. | ................. | 370/419 |
| 2010/0142967 A1* | 6/2010 | Perez | ............................ | 398/135 |

OTHER PUBLICATIONS

Chow, Hungkei, et al., "BIPON: A More Energy-Efficient TDM PON", Techzine Technology and Research E-Zine, Mar. 27, 2012, 6 pages.

* cited by examiner

*Primary Examiner* — Dzung Tran
(74) *Attorney, Agent, or Firm* — Hitt Gaines, PC

(57) ABSTRACT

A clock and data recovery (CDR) circuit, a method of recovering a clock and data from a received raw data stream and a BI-PON optical network transceiver (ONT) receiver front-end incorporating the CDR circuit. In one embodiment, the CDR circuit includes: (1) a line rate CDR circuit having a voltage controlled oscillator, the line rate CDR circuit configured to recover a raw data stream at a receiving line rate, (2) a fixed-rate down-sampler coupled to the line rate CDR circuit and configured to down-sample the raw data stream based on a fixed-rate and (3) a variable-rate down-sampler coupled to the fixed-rate down-sampler and configured further to down-sample the raw data sample based on a variable-rate.

24 Claims, 5 Drawing Sheets

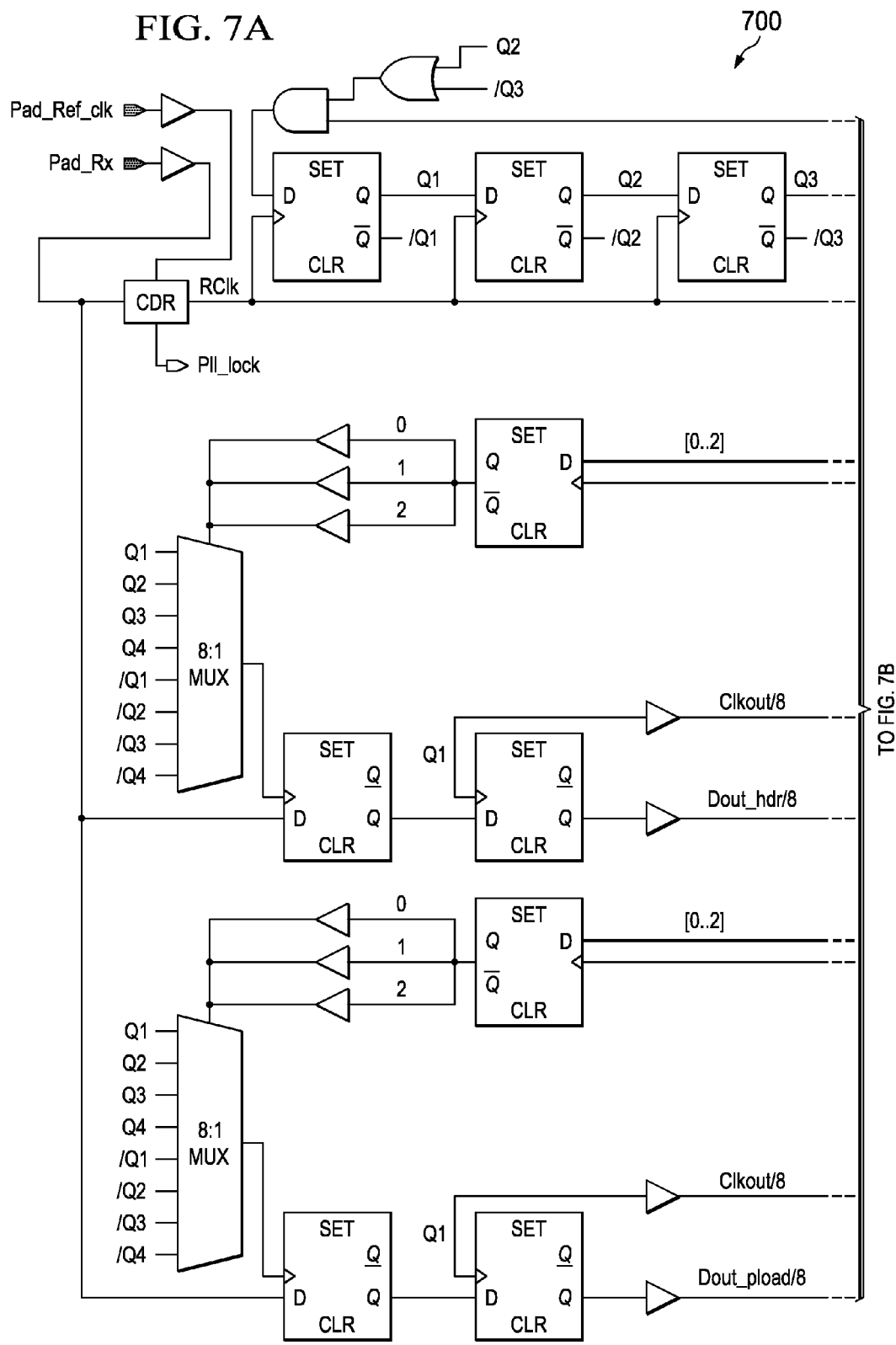

DOWN-SAMPLING CLOCK AND DATA RECOVERY CIRCUIT HAVING SELECTABLE RATE AND PHASE OUTPUT AND METHOD OF OPERATION THEREOF

TECHNICAL FIELD

This application is directed, in general, to clock and data recovery (CDR) circuits and, more specifically, to a down-sampling CDR circuit having a selectable rate and phase output and a method of down-sampling with a selectable rate and phase output.

BACKGROUND

A CDR circuit is a key building block in many high speed wireline data communication applications, such as optical networks, backplane interconnects and chip-to-chip interconnection. Its function is to extract a transmitted data sequence and clocking/timing information from a received signal, which has typically been subjected to noise and signal distortion. The CDR circuit detects signal transitions in the received data and produces a stable clock signal (namely, a recovered clock signal). The recovered clock signal drives a decision circuit that samples the received signal and produces a retimed data stream. A deserializer circuit follows the CDR circuit to convert the recovered bit stream into word-aligned data.

The CDR circuit, together with the deserializer circuit, plays an important role in the overall performance of a high speed transmission system. Not only does it determine bit error rate (BER) and the stability of the transmission link, but also consumes a substantial portion of overall receiver power.

SUMMARY

One aspect provides a CDR circuit. In one embodiment, the CDR circuit includes: (1) a line rate CDR circuit having a voltage controlled oscillator, the line rate CDR circuit configured to recover a raw data stream at a receiving line rate, (2) a fixed-rate down-sampler coupled to the line rate CDR circuit and configured to down-sample the raw data stream based on a fixed-rate and (2) a variable-rate down-sampler coupled to the fixed-rate down-sampler and configured further to down-sample the raw data sample based on a variable-rate.

Another aspect provides a method of recovering a clock and data from a received raw data stream. In one embodiment, the method includes: (1) recovering a raw data stream at a receiving line rate using a voltage controlled oscillator, (2) initially down-sampling the raw data stream based on a fixed rate and (3) further down-sampling the raw data sample based on a variable rate.

Yet another aspect provides a bit-interleaving passive optical network (BI-PON) optical network transceiver (ONT) receiver front-end. In one embodiment, the receiver front-end includes a CDR circuit, including: (1) a line rate CDR circuit having a voltage controlled oscillator, the line rate CDR circuit configured to recover a raw data stream at a receiving line rate, (2) a fixed-rate down-sampler coupled to the line rate CDR circuit and configured to down-sample the raw data stream based on a fixed rate and (3) a variable-rate down-sampler coupled to the fixed-rate down-sampler and configured further to down-sample the raw data sample based on a variable rate.

BRIEF DESCRIPTION

Reference is now made to the following descriptions taken in conjunction with the accompanying drawings, in which.

DETAILED DESCRIPTION

Figure 1:
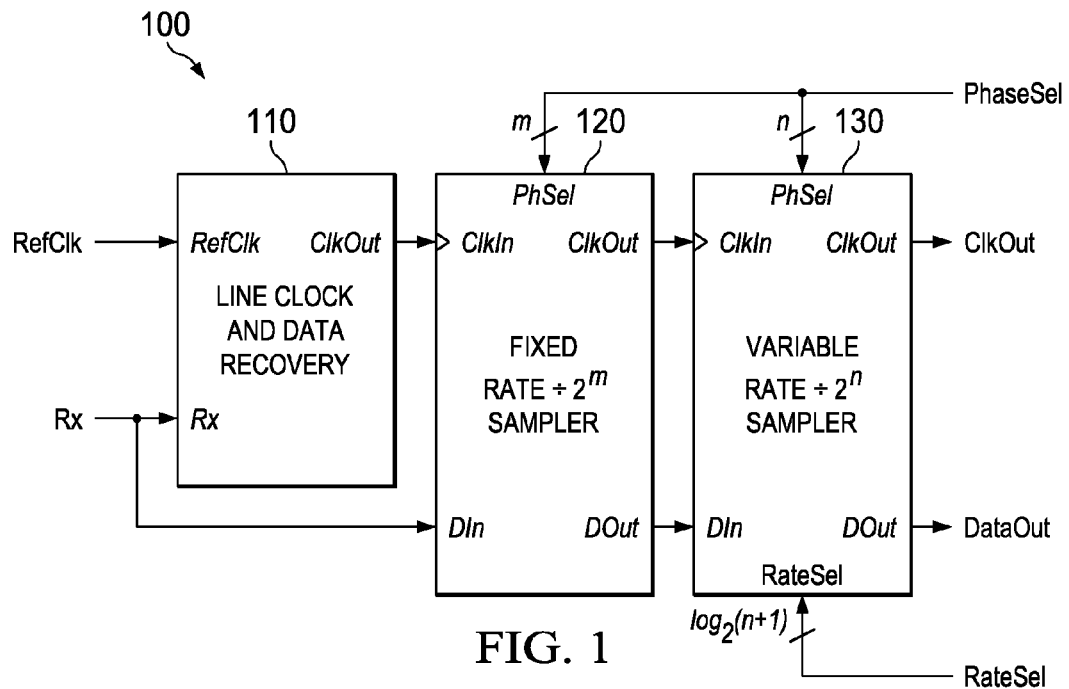
FIG. 1 is a block diagram of one embodiment of a CDR circuit with selectable phase and rate output.

As stated above, a CDR circuit's function is to extract a transmitted data sequence and clocking/timing information from a received signal by detecting signal transitions in the received data and recovering a stable clock signal (or, simply, "clock") from them. The recovered clock drives a decision circuit that samples the received signal and produces a retimed data stream.

In high speed, multi-gigabit receiver design, performance is generally determined by the maximum amount of jitter a receiver can tolerate. Since the received signal is retimed by latching the received (input) signal with the recovered clock, bit errors occur when either the clock or data is sampled too early or too late. To obtain a stable recovered clock, a clock recovery circuit is usually based on a phase-locked loop (PLL), which includes a voltage-controlled oscillator (VCO).

A high performance CDR circuit typically decomposes the VCO control into fine and coarse tuning, acquiring frequency and phase in two sequential steps, or loops. Often using a single VCO, such circuit first enables a frequency tracking loop to lock to a reference clock and monitors the frequency error between the loop frequency and the reference clock. When the frequency error drops to a low threshold value, a lock detector associated with the PLL switches to a phase tracking loop. The phase tracking loop fine tunes the VCO such that the CDR circuit output locks to the received data. Even after the CDR circuit has locked to the incoming data, the lock detector continues to operate. The lock detector switches back to the frequency tracking loop if the phase tracking loop loses lock, usually due to unexpected noise.

The foregoing circuit works well but consumes substantial power. Unfortunately, a major challenge looms in trying to reduce the power consumed by a high performance CDR circuit, stemming from the use of low supply voltages. As the supply voltage is reduced, the tuning range of a VCO is likewise reduced. Consequently, for a given ripple on its control line, the VCO suffers from a greater jitter.

Described herein are various embodiments of a high performance CDR circuit that exhibits substantially less jitter. Certain embodiments of the novel CDR circuit disclosed herein employ an active differential capacitor bank that not only extends, perhaps greatly, the tuning range of an integrated VCO, but is also particularly suitable for an integrated VCO circuit. To reduce the overall power consumption of the CDR circuit, a power-saving loop control method.

Furthermore, conventional CDR circuits typically provide only a fixed-rate data and a recovered clock matching the signaling rate at the line input. Certain embodiments of the novel CDR circuit disclosed herein feature a selectable phase and data rate output for the recovered data. A selectable phase and rate output is especially useful for receiver design requiring a flexible subsampling/decimation capability. As will be evident from the following disclosure, the illustrated embodiments of the novel CDR circuit are simpler and consume less power than conventional CDR circuits.

FIG. 1 shows a simplified block diagram of one embodiment of a novel CDR circuit 100. The CDR circuit 100 includes a line rate CDR circuit 110, a fixed-rate by-$2^m$ down-sampler 120 and a variable-rate by-$2^n$ down-sampler 130. The line rate CDR circuit 110 employs a dual-loop CDR circuit architecture having dual (frequency and phase) tracking loops as described above. The line rate CDR circuit 110 recovers a raw data stream Rx at its receiving line rate R. A reference clock RefClk is chosen such that the receiving line rate R is a multiple of the frequency of the reference clock. As an example, for a Rx line rate of 10 GHz, a reference clock of 78.125 MHz may be chosen with a divider of 128. Further details regarding some embodiments of the line rate CDR circuit 110 will be presented below, along with two features employed with respect to certain embodiments of the line rate CDR circuit 110 that offer the benefit of lower power consumption and better jitter tolerance.

Once the raw data is recovered from the line, it is then sampled by the fixed-rate down-sampler 120, reducing the raw data rate from the line data rate R down to a lower data rate $R/2^m$, matching the general range of the final user selectable rates. The fixed-rate down-sampler 120 includes a phase select input PhSel(m) that determines which phase of the resulting data output should be presented. Further details regarding some embodiments of the fixed-rate down-sampler 120 will be presented below.

After the fixed-rate down-sampling, the recovered data is sampled again using the variable-rate down-sampler 130. The variable-rate down-sampler 130 is configured such that a target down-sampling rate and its corresponding phase offset of the recovered data may be selected within a designated range using respective rate set and phase set inputs RateSel and PhSel(n). Further details regarding some embodiments of the variable-rate down-sampler 130 will be presented below.

Figure 2:
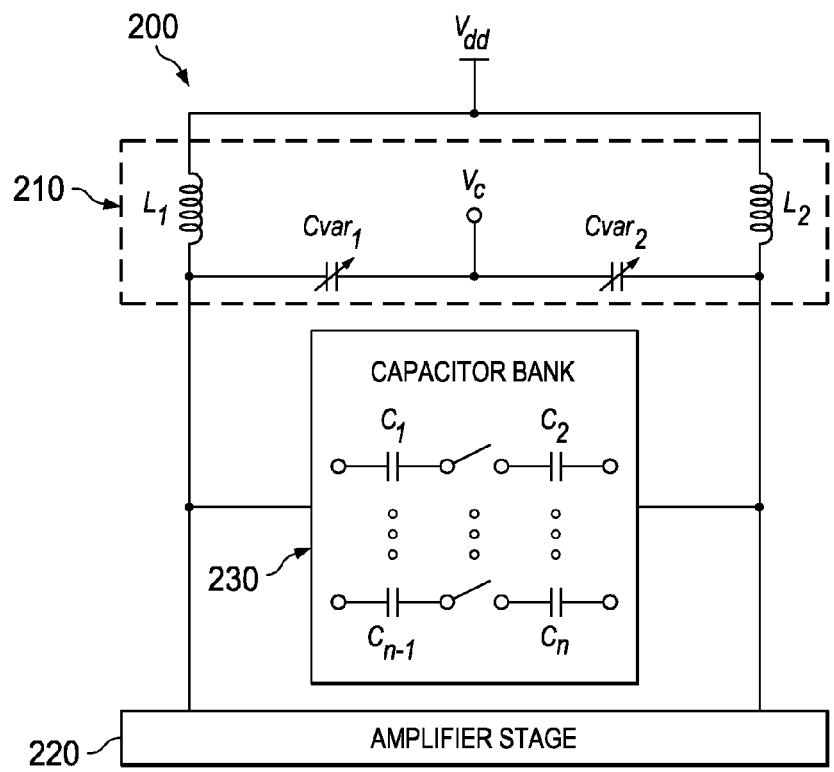
FIG. 2 is a schematic diagram of one embodiment of an integrated voltage-controlled oscillator (VCO)

An integrated, LC-based VCO has recently been widely adopted for many applications because of its low noise characteristics and relatively simple and compact structure. (In the context of this disclosure, "integrated" means able to be fabricated into an integrated circuit.) FIG. 2 illustrates an integrated VCO 200. The VCO includes a resonance element 210 and an amplifier stage 220. The resonance element 210, typically a circuit including inductive and capacitive elements (an "LC tank"), sets the oscillation frequency. Due to the losses in the resonance element 210, the amplifier stage 220 is employed to provide enough gain to sustain oscillation. The frequency of the oscillation is controlled by a varactor, which implements the capacitance the LC tank, with a control voltage Vc. In a fully integrated VCO, the tuning range of the oscillation frequency should be large enough to cover anticipated fabrication process variations and temperature fluctuations. However, the tuning range provided by a simple varactor is typically limited. Unfortunately, increasing sensitivity of the frequency to the control voltage tends to increase phase noise. Therefore, to extend the tuning range, a fixed capacitor bank 230 can be added to adjust the resonant frequency coarsely, while fine tuning is then achieved by means of varactors $Cvar_1$ and $Cvar_2$.

An idealized differential capacitor bank employs a switch coupled between a pair of capacitors, as FIG. 2 shows (e.g., an unreferenced switch between capacitors $C_1$, $C_2$). practical differential capacitor bank uses a metal-oxide-semiconductor field-effect transistor (MOSFET) to implement the switch. However, implementing the switch with a MOSFET introduces two non-ideal characteristics that greatly affect the performance of the VCO. First, a MOSFET has a non-zero ON resistance. This additional resistance affects the quality factor (Q-factor) of the LC tank. To keep the phase noise low, a large MOSFET operating in its triode region is usually required to hold the ON resistance to an acceptable level. Unfortunately, a large MOSFET not only makes the VCO bulky, but even worse has parasitic capacitance that contributes to overall capacitance when the MOSFET is in the OFF state. Such non-negligible capacitance at the OFF state limits the tuning range of the VCO. To reduce this parasitic capacitance, the MOSFET size needs to be reduced substantially.

A differential capacitor bank may be improved by using two MOSFET switches instead of one. In this way, the overall ON resistance can be reduced by half given the same MOSFET size. The MOSFET size can thus be decreased to reduce the impact of the parasitic capacitance while maintaining the Q-factor of the LC tank. Two bias resistors are then typically used to provide DC voltage. The DC voltage is set to reduce the MOSFET ON resistance by increasing the overdrive voltage. Unfortunately, the value of the bias resistor has to be made very large to avoid deterioration of the Q-factor of the LC tank. As those skilled in the pertinent art are aware, a compact, high-value resistor is difficult to implement in an integrated circuit.

Figure 3:
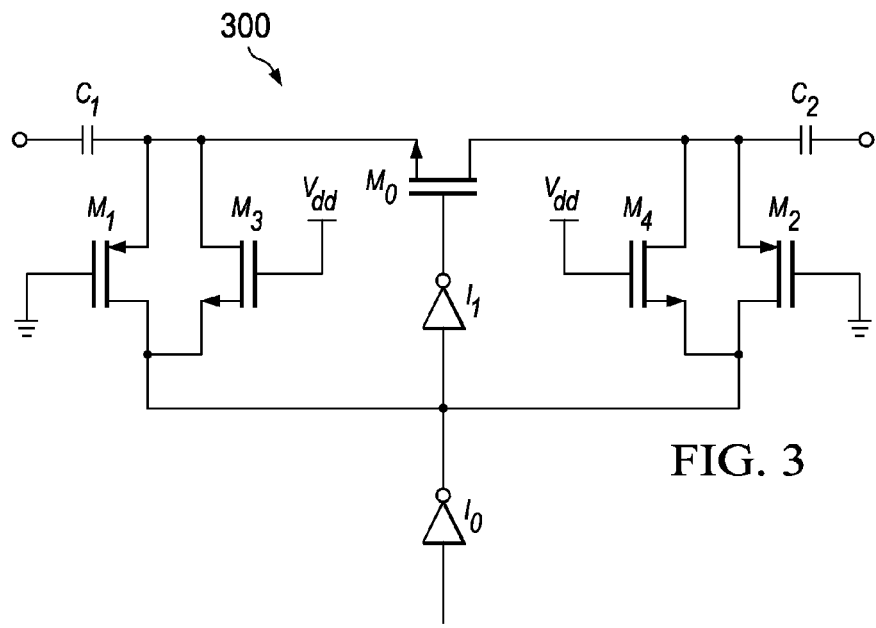
FIG. 3 is a schematic diagram of one embodiment of an active differential capacitor bank.

FIG. 3 illustrates one embodiment of a schematic diagram of an active differential capacitor bank 300 that addresses these issues. The active differential capacitor bank 300 uses inverters $I_0$ and $I_1$ to generate bias and switch control voltages respectively. As a replacement for the bias resistors described above, two transmission gates $M_1$, $M_3$ and $M_2$, $M_4$ are used. When a switch $M_0$ is ON, the MOSFETs in the transmission gates $M_1$, $M_3$ and $M_2$, $M_4$ (working in their triode regions) present a large resistance without introducing significant parasitic capacitance. When the switch $M_0$ is OFF, the bias voltage is high, bringing the source and drain of the switch $M_0$ to Vdd, increasing depletion layers around the switch $M_0$, and further reducing its parasitic capacitance. Furthermore, using a transmission gate $M_1$, $M_3$ instead of a single MOSFET improves the linearity of the parasitic capacitance, decreasing phase noise, especially at the low frequency offset.

Figure 4:
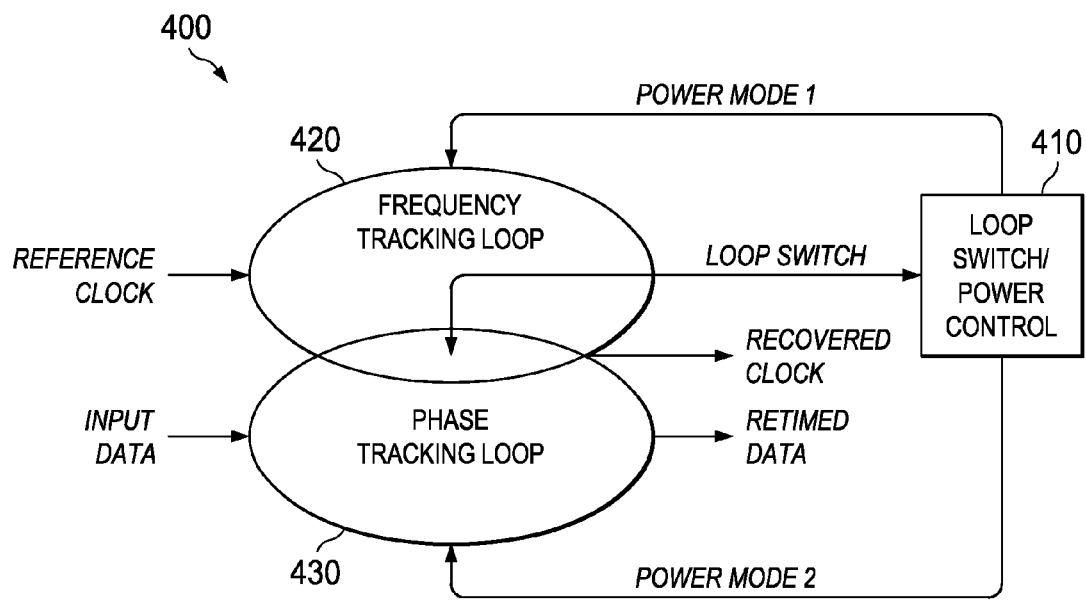
FIG. 4 is a diagram of a dual-loop control method for use with the CDR circuit embodiment of FIG. 1.

FIG. 4 is a diagram of a dual-loop control method 400 for use with the CDR circuit embodiment of FIG. 1. A loop switch/power control block 410 incorporates power control functionality. Shown are a frequency tracking loop 420 and a phase tracking loop 430. As the frequency and phase tracking loops 420, 430 work sequentially, the loop switch/power control block 410 operates in two power modes: P1 and P2. During operation of the frequency tracking loop 420 (clock frequency synthesis), the loop switch/power control block 410 enables power mode P1. During power mode P1, the frequency tracking loop 420 controls the VCO, while unused blocks of the phase tracking loop 430 are powered down. When the clock frequency synthesis is completed, the loop switch/power control block 410 enables power mode P2. In power mode P2, the phase tracking loop 430 controls the VCO. When the frequency tracking loop is no longer needed, its unused blocks are powered down to save power.

Figure 5:
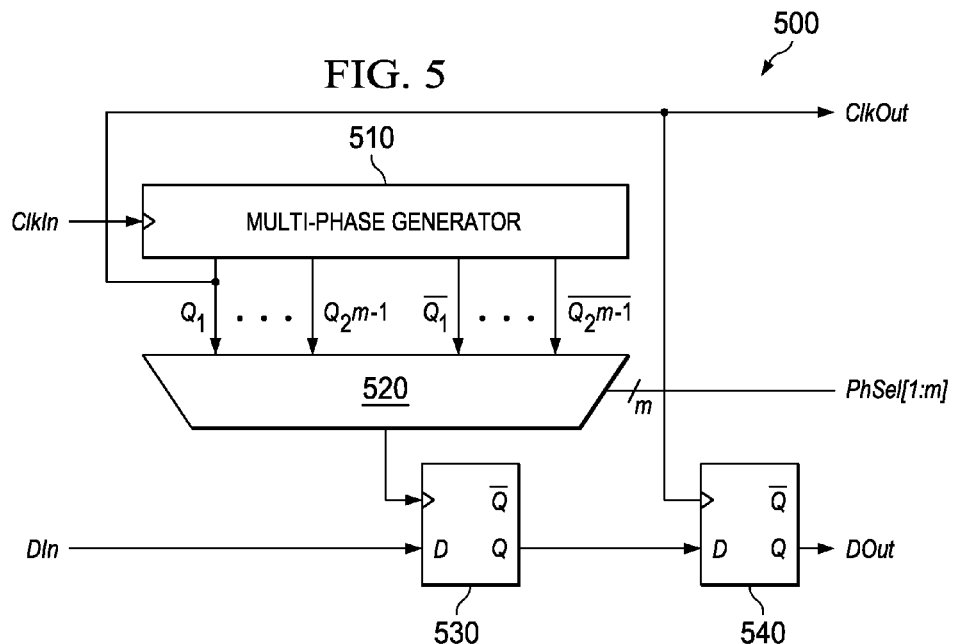
FIG. 5 is a block diagram of one embodiment of a fixed-rate down-sampler.

FIG. 5 is a block diagram of one embodiment of a fixed-rate down-sampler 500. The fixed-rate down-sampler 500 includes a multiphase generator 510, a multiplexer 520 and two flip-flops 530, 540. The multiphase generator 510 implements a modified $2^m$ counter, taking the recovered Rx line clock and producing eight divide-by-$2^3$ output clocks with different phases. Given a PhaseSel input (most significant m bits) the multiplexer 520 selects one of the eight clocks to sample the recovered data stream. The sampled data is then retimed for the next stage. For applications having an extremely high clock frequency at the line rate, e.g., 40 GHz+, the fixed-rate down-sampler 500 may be realized using a higher speed logic circuit with slightly higher power consumption, while other parts of the CDR circuit can be implemented using lower speed logic gates. By doing so, the overall power consumption of the CDR circuit can be kept low.

Figure 6:
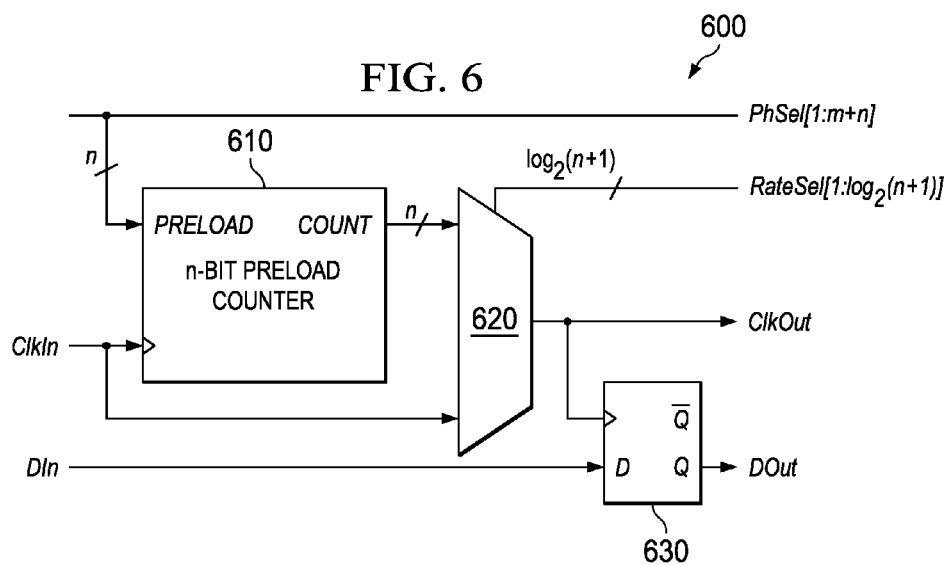
FIG. 6 is a block diagram of one embodiment of a variable-rate down-sampler.

FIG. 6 is a block diagram of one embodiment of a variable-rate down-sampler 600. The core of the variable-rate down-sampler 600 is a modified n-bit preload binary counter 610. The n-bit preload binary counter 610 takes the output clock of the previous stage as a clock input. The n-bit preload binary counter 610 begins counting from a preload value which is set by the second (least significant n bits) part of the PhaseSel input. The n-bit preload binary counter 610 produces all (n+1), divide-by-2 to divide-by-$2^{(n+1)}$) rate clock outputs, together with the original input clock. By using a (n+1):1 multiplexer 620, a target rate output can be selected to sample the recovered data from the previous stage using a flip-flop 630.

Figure 7:
FIG. 7 is a schematic diagram of one embodiment of a BI-PON ONT receiver front-end.
Figure 7B:
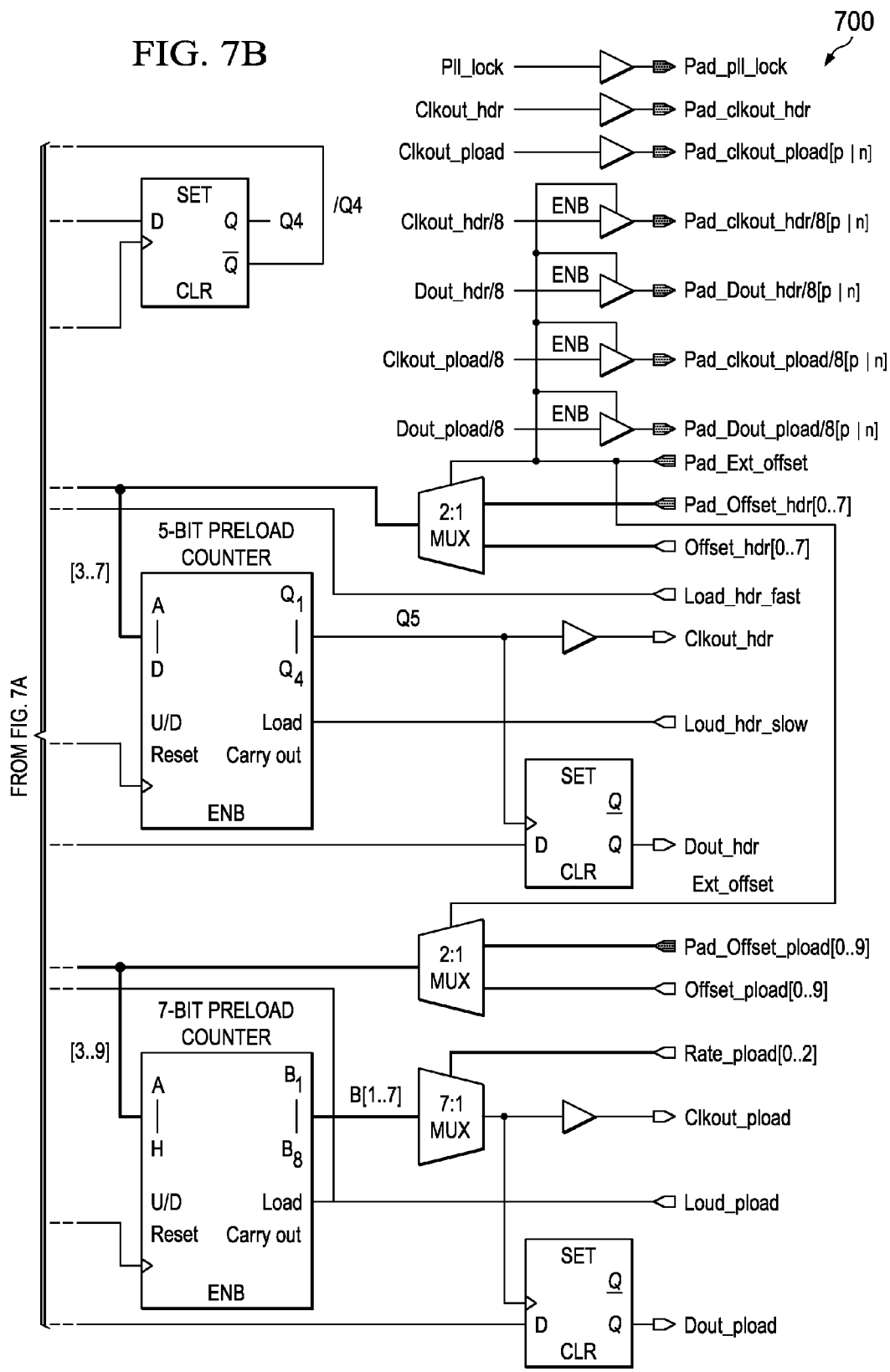

FIG. 7 is a schematic diagram of one embodiment of a BI-PON ONT receiver front-end 700. The front-end 700 implements an embodiment of the CDR circuit disclosed herein having two individually selectable output legs, instead of only one output. The first output leg, "header output," or "hdr," has a fixed target rate of divide-by-$2^8$ but with a fully selectable phase output, i.e., m=3 and n=5. The second output leg, "payload output," or "pload," has a selectable sampling rate ranging from divide-by-$2^3$ to divide-by-$2^{10}$ with a fully selectable phase output, i.e., m=3 and n=7. Further details regarding a protocol that can employ the front-end 700, together with various applications for the front-end 700, may be found at http://www2.alcatel-lucent.com/blogs/techzine/2012/bipon-a-more-energy-efficient-tdm-pon/.

Those skilled in the art to which this application relates will appreciate that other and further additions, deletions, substitutions and modifications may be made to the described embodiments.

What is claimed is:

1. A clock and data recovery (CDR) circuit, comprising:
    a line rate CDR circuit having a voltage controlled oscillator, said line rate CDR circuit configured to recover a raw data stream at a receiving line rate;
    a fixed-rate down-sampler coupled to said line rate CDR circuit and configured to down-sample said raw data stream based on a fixed-rate; and
    a variable-rate down-sampler coupled to said fixed-rate down-sampler and configured further to down-sample said raw data sample based on a variable-rate.

2. The CDR circuit as recited in claim 1 wherein said voltage controlled oscillator is controlled by a frequency tracking control loop and a phase tracking control loop.

3. The CDR circuit as recited in claim 2 wherein said line rate CDR circuit includes a loop switch/power control block configured to power down unused blocks of said phase tracking loop when said frequency tracking loop controls said voltage controlled oscillator and power down unused blocks of said frequency tracking loop when said phase tracking loop controls said voltage controlled oscillator.

4. The CDR circuit as recited in claim 1 wherein said voltage controlled oscillator has an active differential capacitor bank.

5. The CDR circuit as recited in claim 1 wherein said fixed-rate down-sampler has a selectable phase.

6. The CDR circuit as recited in claim 1 wherein said variable-rate down-sampler has a selectable phase and sampling rate.

7. The CDR circuit as recited in claim 1 wherein said fixed-rate down-sampler includes a multiphase generator having a counter.

8. The CDR circuit as recited in claim 1 wherein said variable-rate down-sampler includes a preload binary counter configured to produce n+1 divide-by-$2^n$ rate clock outputs.

9. A method of recovering a clock and data from a received raw data stream, comprising:
    recovering a raw data stream at a receiving line rate using a voltage controlled oscillator;
    initially down-sampling said raw data stream based on a fixed rate; and
    further down-sampling said raw data sample based on a variable rate.

10. The method as recited in claim 9 wherein said voltage controlled oscillator is controlled by a frequency tracking control loop and a phase tracking control loop.

11. The method as recited in claim 10 wherein said recovering comprises:
    powering down unused blocks of said phase tracking loop when said frequency tracking loop controls said voltage controlled oscillator; and
    powering down unused blocks of said frequency tracking loop when said phase tracking loop controls said voltage controlled oscillator.

12. The method as recited in claim 9 wherein said voltage controlled oscillator has an active differential capacitor bank.

13. The method as recited in claim 9 wherein said initially down-sampling is carried out at a selectable phase.

14. The method as recited in claim 9 wherein said further down-sampling is carried out at a selectable phase and sampling rate.

15. The method as recited in claim 9 wherein said initially down-sampling comprises employing a multiphase generator having a counter.

16. The method as recited in claim 9 wherein said further down-sampling comprises employing a preload binary counter configured to produce n+1 divide-by-$2^n$ rate clock outputs.

17. A BI-PON optical network transceiver (ONT) receiver front-end, comprising:
    a clock and data recovery (CDR) circuit, including:
    a line rate CDR circuit having a voltage controlled oscillator, said line rate CDR circuit configured to recover a raw data stream at a receiving line rate,
    a fixed-rate down-sampler coupled to said line rate CDR circuit and configured to down-sample said raw data stream based on a fixed rate, and
    a variable-rate down-sampler coupled to said fixed-rate down-sampler and configured further to down-sample said raw data sample based on a variable rate.

18. The receiver front-end as recited in claim 17 wherein said voltage controlled oscillator is controlled by a frequency tracking control loop and a phase tracking control loop.

19. The receiver front-end as recited in claim 18 wherein said line rate CDR circuit includes a loop switch/power control block configured to power down unused blocks of said phase tracking loop when said frequency tracking loop controls said voltage controlled oscillator and power down unused blocks of said frequency tracking loop when said phase tracking loop controls said voltage controlled oscillator.

20. The receiver front-end as recited in claim 17 wherein said voltage controlled oscillator has an active differential capacitor bank.

21. The receiver front-end as recited in claim 17 wherein said fixed-rate down-sampler has a selectable phase.

22. The receiver front-end as recited in claim 17 wherein said variable-rate down-sampler has a selectable phase and sampling rate.

23. The receiver front-end as recited in claim 17 wherein said fixed-rate down-sampler includes a multiphase generator having a counter.

24. The receiver front-end as recited in claim 17 wherein said variable-rate down-sampler includes a preload binary counter configured to produce n+1 divide-by-$2^n$ rate clock outputs.

* * * * *